United States Patent
Kouchi

(10) Patent No.: US 10,292,273 B2
(45) Date of Patent: May 14, 2019

(54) FLEXIBLE PRINTED CIRCUIT BOARD, ANTENNA, AND WIRELESS CHARGING DEVICE

(71) Applicant: SUMITOMO ELECTRIC PRINTED CIRCUITS, INC., Koka-shi, Shiga (JP)

(72) Inventor: Masahiko Kouchi, Shiga (JP)

(73) Assignee: SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/325,470

(22) PCT Filed: Jul. 14, 2015

(86) PCT No.: PCT/JP2015/070118
§ 371 (c)(1),
(2) Date: Jan. 11, 2017

(87) PCT Pub. No.: WO2016/010025
PCT Pub. Date: Jan. 21, 2016

(65) Prior Publication Data
US 2017/0164483 A1   Jun. 8, 2017

(30) Foreign Application Priority Data

Jul. 17, 2014   (JP) ................. 2014-147241

(51) Int. Cl.
*H05K 1/18* (2006.01)
*H01F 38/14* (2006.01)
*H01Q 1/38* (2006.01)
*H05K 1/02* (2006.01)
*H01F 27/28* (2006.01)
*H01F 17/00* (2006.01)

(52) U.S. Cl.
CPC ........ *H05K 1/189* (2013.01); *H01F 27/2804* (2013.01); *H01F 38/14* (2013.01); *H01Q 1/38* (2013.01); *H05K 1/028* (2013.01); *H05K 1/0296* (2013.01); *H01F 2017/006* (2013.01); *H05K 2201/0364* (2013.01); *H05K 2201/05* (2013.01); *H05K 2201/055* (2013.01); *H05K 2201/086* (2013.01); *H05K 2201/10098* (2013.01)

(58) Field of Classification Search
CPC ..................................... H05K 1/189
USPC ........................................ 174/250
See application file for complete search history.

(56) References Cited

U.S. PATENT DOCUMENTS

| | | | | |
|---|---|---|---|---|
| 2006/0290493 | A1* | 12/2006 | Taki ........... | G06K 17/00 340/568.1 |
| 2013/0321373 | A1* | 12/2013 | Yoshizumi ........... | G09G 5/00 345/211 |
| 2014/0134401 | A1* | 5/2014 | Park ........... | H01F 1/375 428/155 |

FOREIGN PATENT DOCUMENTS

| | | | | |
|---|---|---|---|---|
| JP | H11-266545 A | | 9/1999 | |
| JP | 2003-022912 | * | 1/2003 | ............. H01F 17/00 |

(Continued)

*Primary Examiner* — Stanley Tso
(74) *Attorney, Agent, or Firm* — Drinker Biddle & Reath LLP

(57) ABSTRACT

A flexible printed circuit board according to an embodiment of the present invention includes at least one insulating layer having flexibility and containing a synthetic resin as a main component; and at least one conducting layer including a circuit pattern, wherein the circuit pattern includes a continuous spiral pattern, and the flexible printed circuit board includes a curved portion that curves such that one side and another side of the spiral pattern are disposed close to each other.

6 Claims, 2 Drawing Sheets

(56) References Cited

FOREIGN PATENT DOCUMENTS

| JP | 2003-022912 A | | 1/2003 | |
|----|---------------|---|--------|---|
| JP | 2005-033461 | * | 2/2005 | ............... H04B 1/59 |
| JP | 2005-033461 A | | 2/2005 | |
| JP | 2010-63007 A | | 3/2010 | |
| JP | 2014-27389 A | | 2/2014 | |

* cited by examiner

FLEXIBLE PRINTED CIRCUIT BOARD, ANTENNA, AND WIRELESS CHARGING DEVICE

TECHNICAL FIELD

The present invention relates to a flexible printed circuit board, an antenna, and a wireless charging device.

BACKGROUND ART

In recent years, with the wide-spread use of items employing the Near Field Communication (NFC) technology such as the RFID (Radio Frequency IDentification) system and noncontact IC cards, devices using a coil as an antenna are widely used. A known example of such a device is a wireless (noncontact) charging device employing the electromagnetic induction phenomenon. In this wireless charging device, a receiving antenna (secondary coil) is placed so as to face a transmitting antenna (primary coil), and a magnetic flux generated by passing a current through the transmitting antenna is used to generate a current in the receiving antenna. Such antennas are becoming common as charging devices for mobile devices (for example, refer to Japanese Unexamined Patent Application Publication No. 11-266545).

CITATION LIST

Patent Literature

PTL 1: Japanese Unexamined Patent Application Publication No. 11-266545

SUMMARY OF INVENTION

Technical Problem

Such an antenna for mobile devices is required to have a small size and enable efficient power transmission. However, a reduction in the size of an antenna is limited because, when the antenna is formed with a conventional enameled-wire coil, the thickness of the coil needs to be increased in order to increase the inductance per unit area. In addition, when the number of turns of the coil is simply increased, the potential difference between one end and the other end of the coil increases. This causes generation of a non-uniform magnetic field, resulting in a decrease in the efficiency of transmission and reception of electricity. Similarly, such problems may also occur in transformers using conventional enameled-wire coils.

Under the above-described circumstances, the present invention has been made. An object is to provide a flexible printed circuit board, an antenna, and a wireless charging device that have small sizes and enable efficient transmission and reception of electricity.

Solution to Problem

A flexible printed circuit board according to an embodiment of the present invention having been made to achieve the above-described object, includes at least one insulating layer having flexibility and containing a synthetic resin as a main component; and at least one conducting layer including a circuit pattern, wherein the circuit pattern includes a continuous spiral pattern, and the flexible printed circuit board includes a curved portion that curves such that one side and another side of the spiral pattern are disposed close to each other.

An antenna according to an embodiment of the present invention having been made to achieve the above-described object, includes the flexible printed circuit board.

A wireless charging device according to an embodiment of the present invention having been made to achieve the above-described object, includes a transmitter and a receiver, wherein the transmitter or the receiver includes the antenna.

Advantageous Effects of Invention

A flexible printed circuit board, an antenna, and a wireless charging device according to the present invention have small sizes and enable efficient transmission and reception of electricity.

Figure 1:
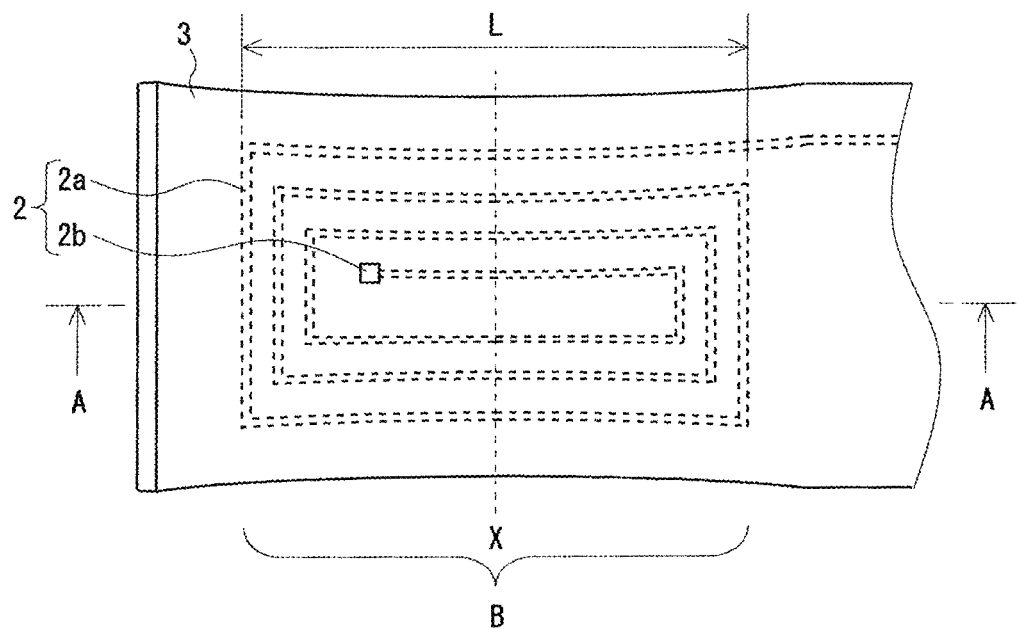
FIG. 1 is a schematic plan view of a flexible printed circuit board according to an embodiment of the present invention, viewed from its front surface side.

REFERENCE SIGNS LIST 1 insulating layer
2 conducting layer
2*a* circuit pattern
2*b* connection terminal
3 coverlay
3*a* covering film
3*b* adhesive layer
4 magnetic layer
4*a* magnetic sheet
4*b* adhesive layer
B curved portion
X curvature center line

DESCRIPTION OF EMBODIMENTS

Description of Embodiments of the Present Invention

A flexible printed circuit board according to an embodiment of the present invention includes at least one insulating layer having flexibility and containing a synthetic resin as a main component; and at least one conducting layer including a circuit pattern, wherein the circuit pattern includes a continuous spiral pattern, and the flexible printed circuit board includes a curved portion that curves such that one side and another side of the spiral pattern are disposed close to each other.

The flexible printed circuit board includes the curved portion, which curves such that one side and the other side of the continuous spiral pattern forming a coil are disposed close to each other. This provides a coil in which magnetic fluxes three-dimensionally intersect, which enables a considerable increase in the coupling coefficient of the coil. The flexible printed circuit board enables an increase in the number of turns of the coil and adjustment of inductance while an increase in the area and thickness of the coil is suppressed, to thereby increase the coupling coefficient and also achieve a reduction in the size. In addition, the flexible printed circuit board is easily incorporated into items having a large number of curved surfaces such as wearable terminals.

The curved portion preferably has an average radius of curvature of 1 mm or more and 500 mm or less. The curved portion is thus formed so as to have an average radius of curvature in such a range, to thereby increase the coupling coefficient of the coil with ease and certainty and also facilitate incorporation into wearable terminals and the like.

The spiral pattern preferably has a quadrangular or circular outer shape, and the curved portion preferably curves with respect to, as a center line, a symmetry axis of the quadrangle or circle. The spiral pattern is thus formed so as to have a quadrangular or circular outer shape, to thereby increase the area efficiency and production efficiency. In addition, the curved portion is formed so as to curve with respect to, as the center line, a symmetry axis of the quadrangle or circle, to thereby expand the region where magnetic fluxes intersect. This results in a further increase in the coupling coefficient of the coil, in other words, further enhancement of the effect of concentrating magnetic fluxes.

The spiral pattern preferably has a rectangular or elliptical outer shape, and the curved portion preferably curves with respect to, as a center line, a minor axis of the rectangle or ellipse. The spiral pattern is thus formed so as to have a rectangular or elliptical outer shape, and the curved portion is formed so as to curve with respect to, as the center line, the minor axis of the outer shape, to thereby increase the coupling coefficient of the coil with more certainty.

The flexible printed circuit board preferably further includes a magnetic layer. The magnetic layer is provided, to thereby block magnetic fluxes generated by the spiral pattern to prevent the magnetic fluxes from affecting the surrounding circuits.

The antenna according to another embodiment of the present invention includes the flexible printed circuit board.

Since the antenna includes the flexible printed circuit board, it enables a reduction in its size and also efficient transmission and reception of electricity.

A wireless charging device according to still another embodiment of the present invention includes a transmitter and a receiver, wherein the transmitter or the receiver includes the antenna.

Since at least one of the transmitter and the receiver includes the antenna, the wireless charging device enables a reduction in the size and also has very high electricity transmission-reception efficiency.

Incidentally, the term "spiral" is not limited to truly spiral configurations, and is a concept that also encompasses a configuration in which plural circular arcs or plural polygonal portions are arranged so as to form multi-rows, and ends of outer circular arcs or polygonal portions are connected to ends of inner circular arcs or polygonal portions via straight lines or curved lines. The term "quadrangle" means a quadrangle in which two adjacent sides are orthogonal to each other, such as a rectangle or a square. The term "quadrangular" is a concept that is not limited to true quadrangles but also encompasses, for example, a configuration in which vertexes do not have exact right angles (rounded vertexes), a configuration in which sides slightly curve, and a configuration in which sides are plural straight lines that are substantially parallel to each other (angles formed therebetween are 5° or less) and are connected together. The term "circle" means a curved configuration having two or more symmetry axes, such as an ellipse or a perfect circle. The term "circular" is a concept that is not limited to true circles but also encompasses, for example, a configuration not having a constant curvature and a configuration partially having a straight line (for example, for 10% or less of the whole circumference). The term "symmetry axis" means a line that passes through the geometric center of gravity of a figure to divide it into portions having line symmetry with respect to the line. The term "rectangle" means a quadrangle in which two adjacent sides have different lengths. The term "ellipse" means a circle in which the major axis and the minor axis have different lengths.

Details of Embodiments of the Present Invention

Hereinafter, a flexible printed circuit board according to an embodiment of the present invention will be described in detail with reference to drawings. Incidentally, the meanings of "front and back" of the flexible printed circuit board according to the embodiment are as follows: in the thickness direction of the flexible printed circuit board, a side on which a conducting layer is formed is referred to as "front", while the other side opposite to the side on which the conducting layer is formed is referred to as "back"; and these front and back do not mean the front and back of the flexible printed circuit board being used.

Figure 2:
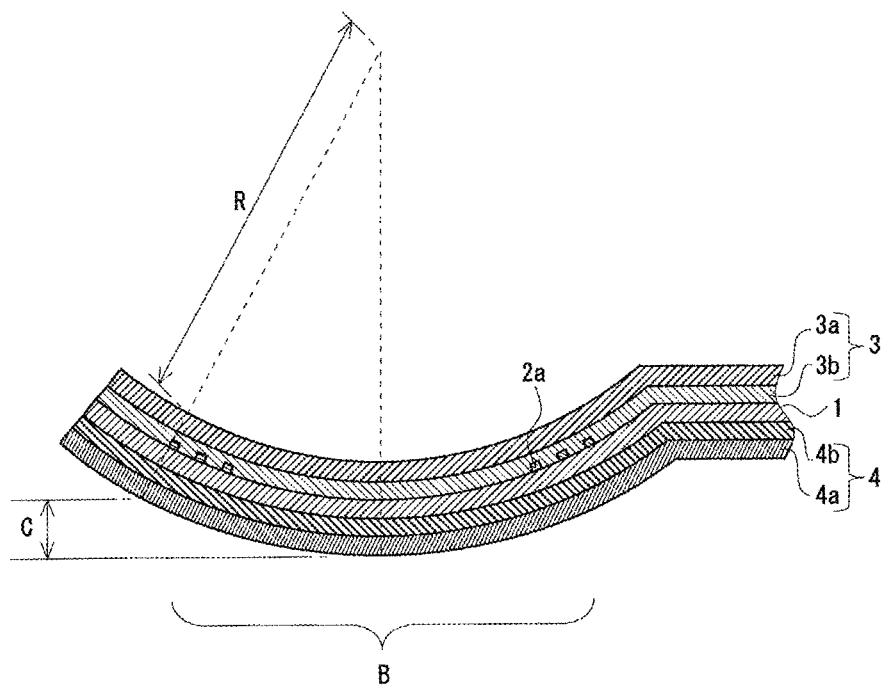
FIG. 2 is a schematic sectional view taken along line A-A in FIG. 1.

The flexible printed circuit board in FIGS. 1 and 2 includes a single insulating layer having flexibility and containing a synthetic resin as the main component, and a single conducting layer having a circuit pattern. In other words, the flexible printed circuit board mainly includes an insulating layer 1 and a conducting layer 2 formed on the front surface of the insulating layer 1. The flexible printed circuit board further includes a coverlay 3 disposed on the front surface of the conducting layer 2, and a magnetic layer 4 disposed on the back surface of the insulating layer 1. In the flexible printed circuit board, the circuit pattern includes a continuous spiral pattern, and a curved portion B curves such that one side and the other side of the spiral pattern are disposed close to each other.

The flexible printed circuit board is appropriately designed in terms of thickness in accordance with the use thereof. In this embodiment, the flexible printed circuit board, which includes the single insulating layer 1 and the conducting layer 2 formed only on a single surface of the insulating layer 1, may have an average thickness of 30 μm or more and 100 μm or less.

<Insulating Layer>

The insulating layer 1 has flexibility and an electrical insulating property and is formed of a synthetic resin. The insulating layer 1 also serves as a base film (substrate) on which the conducting layer 2 is formed.

The material for the insulating layer 1 is not particularly limited as long as it has flexibility and an insulating property. This material may be a low-dielectric-constant synthetic-resin film formed so as to have the shape of a sheet. Examples of the main component of this synthetic-resin film include polyimide, polyethylene terephthalate, liquid crystal polymers, and fluororesins. Incidentally, the main component denotes a component of the highest content, for example, a component accounting for 50 mass % or more of the material.

The lower limit of the average thickness of the insulating layer 1 is preferably 5 more preferably 10 μm. The upper limit of the average thickness of the insulating layer 1 is preferably 50 μm, more preferably 40 μm. When the average thickness of the insulating layer 1 is less than the lower limit, the insulating layer 1 may have an insufficient insulating strength. On the other hand, when the average thickness of the insulating layer 1 is more than the upper limit, the flexible printed circuit board may have an excessively large thickness.

<Conducting Layer>

The conducting layer 2 is formed of a material having conductivity and is formed on the front surface of the insulating layer 1. The conducting layer 2 includes a circuit pattern 2a and a connection terminal 2b.

The material for the conducting layer 2 is not particularly limited as long as it has conductivity. This material preferably has a low electric resistance. The conducting layer 2 may be formed of, for example, copper or silver. The conducting layer 2 may be plated with, for example, gold, silver, tin, or nickel. Alternatively, the conducting layer 2 may be formed by printing with, for example, a paste or ink containing a metal such as copper, silver, or nickel.

The lower limit of the average thickness of the conducting layer 2 is preferably 0.1 µm, more preferably 1 µm. The upper limit of the average thickness of the conducting layer 2 is preferably 100 µm, more preferably 80 µm. When the average thickness of the conducting layer 2 is less than the lower limit, the internal resistance may become high, which results in excessively high loss, and the strength may become insufficient, which increases the probability of breakage of the conducting layer 2. When the average thickness of the conducting layer 2 is more than the upper limit, the flexible printed circuit board may have an excessively large thickness or may have insufficient flexibility.

The circuit pattern 2a of the conducting layer 2 includes a spiral pattern. This spiral pattern constitutes a single closed loop. The outer shape of the spiral pattern (shape formed by the outermost wiring) is not particularly limited and may be quadrangular such as square or rectangular, or circular such as perfectly circular or elliptical. Incidentally, the term "single closed loop" means a single continuous circuit that has no branch or breakpoint.

As illustrated in FIG. 1, the conducting layer 2 includes the connection terminal 2b connected to an end portion of the innermost wiring of the spiral pattern. This connection terminal 2b and another connection terminal (not shown) connected to the outermost wiring of the spiral pattern constitute a pair of connection terminals of the spiral pattern.

The lower limit of the average width of the circuit pattern 2a is preferably 0.03 mm, more preferably 0.2 mm. The upper limit of the average width of the circuit pattern 2a is preferably 1.5 mm, more preferably 1.25 mm. When the average width of the circuit pattern 2a is less than the lower limit, the circuit pattern 2a may have insufficient mechanical strength and may break. On the other hand, when the average width of the circuit pattern 2a is more than the upper limit, the flexible printed circuit board may have an excessively large size. Incidentally, in this embodiment, the spiral pattern of the circuit pattern 2a preferably has a constant width.

The loop gap width of the spiral pattern in plan view is not particularly limited, and may be, for example, 0.02 mm or more and 4.5 mm or less.

The number of turns of the spiral pattern is appropriately designed in accordance with, for example, the intended use of the flexible printed circuit board or the target inductance, and is, for example, 2 or more and 100 or less.

<Coverlay>

The coverlay 3 in the flexible printed circuit board protects mainly the conducting layer 2. The coverlay 3 includes a covering film 3a and an adhesive layer 3b. Incidentally, an opening is optionally formed in a region of the coverlay 3, the region corresponding to a position where the connection terminal 2b is disposed.

(Covering Film)

The covering film 3a has flexibility and an insulating property. Examples of the main component of the covering film 3a include polyimide, epoxy resins, phenolic resins, acrylic resins, polyester, thermoplastic polyimide, polyethylene terephthalate, fluororesins, and liquid crystal polymers. Of these, polyimide is preferred from the viewpoint of heat resistance. The covering film 3a preferably contains a high-dielectric-constant material as the main component. The covering film 3a may contain, for example, a resin other than the main component, a weatherproof-imparting agent, or an antistatic agent.

The lower limit of the average thickness of the covering film 3a is not particularly limited, and is preferably 3 µm, more preferably 10 µm. The upper limit of the average thickness of the covering film 3a is not particularly limited, and is preferably 500 µm, more preferably 150 µm. When the average thickness of the covering film 3a is less than the lower limit, protection for the conducting layer 2 and the like may become insufficient, and, in the case of forming the covering film 3a so as to have an insulating property, a sufficient insulating property may not be provided. On the other hand, when the average thickness of the covering film 3a is more than the upper limit, the incremental protection effect for the conducting layer 2 and the like may become weak, and the covering film 3a may have insufficient flexibility.

(Adhesive Layer)

The adhesive forming the adhesive layer 3b is not particularly limited, and is preferably an adhesive having high plasticity and high heat resistance. Examples of such an adhesive include various resin adhesives such as epoxy resins, polyimide, polyester, phenolic resins, polyurethane, acrylic resins, melamine resins, and polyamide-imide.

The lower limit of the average thickness of the adhesive layer 3b is preferably 5 µm, more preferably 10 µm. The upper limit of the average thickness of the adhesive layer 3b is preferably 50 µm, more preferably 40 µm. When the average thickness of the adhesive layer 3b is less than the lower limit, the coverlay 3 may have insufficient bonding strength to the conducting layer 2 and the insulating layer 1. On the other hand, when the average thickness of the adhesive layer 3b is more than the upper limit, the flexible printed circuit board may have an excessively large thickness or may have insufficient flexibility.

<Magnetic Layer>

The magnetic layer 4, which is disposed on the back surface of the insulating layer 1, blocks magnetic fluxes generated by the spiral pattern to prevent the magnetic fluxes from affecting the surrounding circuits. The magnetic layer 4 includes a magnetic sheet 4a and an adhesive layer 4b.

(Magnetic Sheet)

The magnetic sheet 4a may be, for example, a sheet prepared by dispersing a magnetic material in a synthetic resin, or a sheet prepared by forming plural cracks (division grooves) in a sheet-shaped magnetic material and covering this material with a protective film. The magnetic sheet having plural cracks is preferred from the viewpoint that the flexible printed circuit board is easily curved in the curved portion B. The cracks may be formed so as to have a grid pattern, for example. Such cracks are formed in advance, to thereby prevent a change in the magnetic permeability due to breakage of the magnetic material during formation of the curved portion B.

The protective film used for the magnetic sheet 4a is not particularly limited as long as it prevents the magnetic material from scattering and falling off. The protective film is, for example, a film containing a synthetic resin such as polyethylene terephthalate as the main component.

The lower limit of the average thickness of the magnetic sheet 4a is preferably 10 μm, more preferably 20 μm. On the other hand, the upper limit of the average thickness of the magnetic sheet 4a is preferably 1000 μm, more preferably 500 μm. When the average thickness of the magnetic sheet 4a is less than the lower limit, the magnetic sheet 4a may not sufficiently block the magnetic fluxes formed by the spiral pattern. When the average thickness of the magnetic sheet 4a is more than the upper limit, the flexible printed circuit board may have an excessively large thickness or may have insufficient flexibility.

(Adhesive Layer)

The adhesive forming the adhesive layer 4b of the magnetic layer 4 is not particularly limited, and may be the same as that for the adhesive layer 3b of the coverlay 3.

The lower limit of the average thickness of the adhesive layer 4b is preferably 5 μm, more preferably 10 μm. The upper limit of the average thickness of the adhesive layer 4b is preferably 50 μm, more preferably 40 μm. When the average thickness of the adhesive layer 4b is less than the lower limit, the magnetic layer 4 may have insufficient bonding strength to the insulating layer 1. On the other hand, when the average thickness of the adhesive layer 4b is more than the upper limit, the flexible printed circuit board may have an excessively large thickness or may have insufficient flexibility.

<Curved Portion>

The curved portion B is a portion of the flexible printed circuit board in which the insulating layer 1, the conducting layer 2, the coverlay 3, and the magnetic layer 4 curve with respect to, as the center line, a line parallel to the front surface of the flexible printed circuit board. Specifically, the curved portion B denotes, within the curved portion of the flexible printed circuit board, a portion of the flexible printed circuit board being developed into a flat configuration, the portion including the region of the spiral pattern. Incidentally, the term "curved" means that a section of the flexible printed circuit board curves, the section being perpendicular to the front surface of the flexible printed circuit board.

When the spiral pattern has a quadrangular or circular outer shape, the curved portion B preferably curves with respect to, as a curvature center line X, a symmetry axis of the quadrangle or circle. Depending on the outer shape of the spiral pattern, there may be plural symmetry axes; the curvature center line X can be appropriately selected from these symmetry axes. Furthermore, when the spiral pattern has a rectangular or elliptical outer shape, the curved portion B more preferably curves with respect to, as the curvature center line X, the minor axis of the rectangle or ellipse. The curved portion B may curve with respect to, as the curvature center line X, a line other than the minor axis of the rectangle or ellipse, for example, the major axis of the rectangle or ellipse; however, in order to efficiently expand the region where the magnetic fluxes of the coil intersect, the minor axis is preferably selected as the curvature center line X. Alternatively, the curved portion B may curve with respect to, as the curvature center line X, a straight line other than the symmetry axes such as the minor axis and the major axis. Incidentally, the radius of curvature of the curved portion B is preferably constant.

The lower limit of the average radius of curvature R of the curved portion B is preferably 1 mm, more preferably 3 mm. On the other hand, the upper limit of the average radius of curvature R of the curved portion B is preferably 500 mm, more preferably 300 mm. When the average radius of curvature R of the curved portion B is less than the lower limit, the effect of increasing the coupling coefficient of the coil may become insufficient. Conversely, when the average radius of curvature R of the curved portion B is more than the upper limit, the curved portion B may become difficult to form. Incidentally, the average radius of curvature R can be determined by, for example, summing up radii of curvature per unit length of the curved portion B over the total length of the curved portion B (length in a direction perpendicular to the curvature center line X, in the front surface of the curved portion B), and dividing the sum by the total length of the curved portion B.

The lower limit of the ratio of the average radius of curvature R of the curved portion B to the curved portion length L of the spiral pattern is preferably 0.01, more preferably 0.1. On the other hand, the upper limit of the ratio of the average radius of curvature R of the curved portion B to the curved portion length L of the spiral pattern is preferably 100, more preferably 50. When the ratio is less than the lower limit, the curved portion B may become difficult to form. Conversely, when the ratio is more than the upper limit, the effect of increasing the coupling coefficient of the coil may become insufficient. Incidentally, the phrase "the curved portion length L of the spiral pattern" means, in the flexible printed circuit board being developed into a flat configuration (uncurved configuration), among the wirings included in the curved portion B, the distance between the outermost wirings of the spiral pattern in a direction perpendicular to the curvature center line X. The phrase "the distance between wirings" means the distance between the outer wiring rims of the spiral pattern.

The lower limit of the amount of curvature C of the curved portion B is preferably 0.02 mm, more preferably 0.05 mm. On the other hand, the upper limit of the amount of curvature C of the curved portion B is preferably 50 mm, more preferably 30 mm. When the amount of curvature C of the curved portion B is less than the lower limit, the effect of increasing the coupling coefficient of the coil may become insufficient. Conversely, when the amount of curvature C of the curved portion B is more than the upper limit, the curved portion B may become difficult to form. Incidentally, the phrase "the amount of curvature of the curved portion" means, in a section of the curved portion B taken in a direction perpendicular to the curvature center line X, the maximum distance in the curvature direction between two points on the outer surface of the curved portion B including the spiral pattern. The term "the curvature direction" means a direction of the normal to the curved portion B with respect to the center of curvature.

Figure 3:
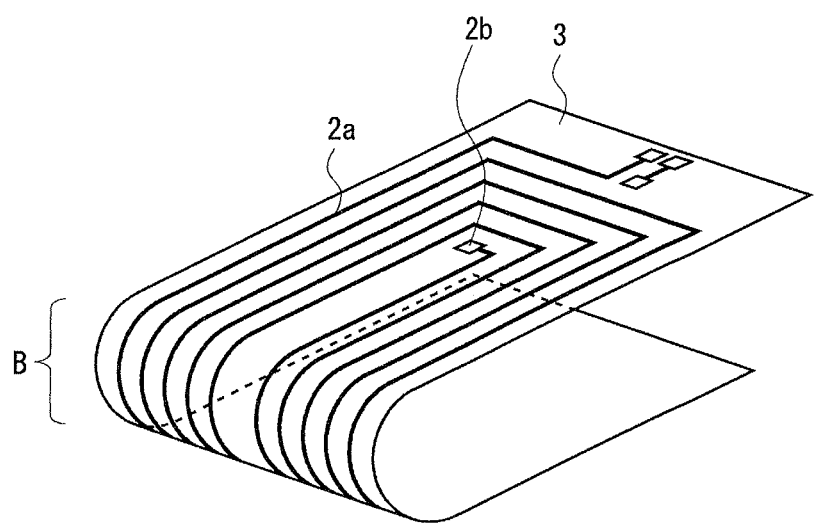
FIG. 3 is a schematic perspective view of a flexible printed circuit board according to an embodiment other than that in FIG. 1.

As illustrated in FIG. 3, the flexible printed circuit board may have a configuration in which the curved portion B has a semicircular section, and approximately a half region and the remaining region of the coil formed by the circuit pattern 2a face each other so as to be substantially parallel to each other, with the curved portion B therebetween. Such a configuration enables the flexible printed circuit board to be readily contained within a mobile terminal, for example, and also enables a further increase in the coupling coefficient. In particular, such a flexible printed circuit board may be similarly disposed in the charging device, to thereby considerably increase the transmission efficiency.

<Production Method>

The flexible printed circuit board can be produced with ease and certainty by, for example, a production method including a conducting layer formation step, a coverlay placement step, a magnetic layer placement step, and a curving step.

(Conducting Layer Formation Step)

In the conducting layer formation step, a conductive material is placed on the front surface of the insulating layer 1 to form the conducting layer 2. The planar configurations of the circuit pattern 2a and connection terminal 2b of the conducting layer 2 can be formed by an appropriate process in accordance with, for example, the process of forming the layer of the conductive material. For example, a metal film formed on the insulating layer 1 may be masked and etched to thereby form the patterns. The metal film may be formed by, for example, bonding of a metal foil or the like to the insulating layer 1 with an adhesive or the like, or vapor deposition of a metal on the insulating layer 1. Alternatively, when the conducting layer 2 is formed from a conductive paste, a printing technique may be employed to form the circuit pattern and terminal.

(Coverlay Placement Step)

In the coverlay placement step, the coverlay 3 is placed on the front surface of the conducting layer 2. Specifically, the coverlay 3 can be formed by bonding the covering film 3a, via the adhesive layer 3b, to the front surfaces of the insulating layer 1 and conducting layer 2.

(Magnetic Layer Placement Step)

In the magnetic layer placement step, the magnetic layer 4 is placed on the back surface of the insulating layer 1. Specifically, the magnetic layer 4 can be formed by bonding the magnetic sheet 4a, via the adhesive layer 4b, to the back surface of the insulating layer 1. Incidentally, one of the coverlay placement step and the magnetic layer placement step may be selected to be performed prior to the other. The magnetic layer placement step may even be performed prior to the conducting layer formation step.

(Curving Step)

In the curving step, the laminated body including the insulating layer 1, the conducting layer 2, the coverlay 3, and the magnetic layer 4 is curved with respect to, as the center, the curvature center line X. This curving may be performed by a known process, for example, by a process of using a jig to curve the flexible printed circuit board.

<Advantages>

The flexible printed circuit board includes the curved portion B, which curves such that one side and the other side of the continuous spiral pattern constituting a coil are disposed close to each other. This provides a coil in which magnetic fluxes intersect three-dimensionally, which results in a considerable increase in the coupling coefficient of the coil. In addition, the flexible printed circuit board enables an increase in the number of turns of the coil and adjustment of inductance while an increase in the area and thickness of the coil is suppressed, to thereby increase the coupling coefficient and also achieve a reduction in the size. Furthermore, the flexible printed circuit board is easily incorporated into items having a large number of curved surfaces such as wearable terminals.

<Antenna>

Because of the above-described advantages of the flexible printed circuit board, an antenna including the flexible printed circuit board facilitates a reduction in the size and also enables efficient transmission and reception of electricity. Therefore, the antenna including the flexible printed circuit board is suitably applicable to wireless receiving antennas and communication antennas of mobile devices such as wearable devices. The frequency band of the antenna is not particularly limited, and is, for example, 30 MHz or less.

Incidentally, in addition to the above-described antenna, the flexible printed circuit board is also applicable to transformers.

<Wireless Charging Device>

In a wireless charging device including a transmitter and a receiver, the transmitter or the receiver includes the antenna, so that at least one of the transmitter and the receiver has high electricity transmission-reception efficiency. As a result, the wireless charging device has very high electricity transmission-reception efficiency and also enables a reduction in the size. In particular, each of the transmitter and the receiver preferably includes the antenna.

Other Embodiments

The embodiments disclosed herein should be understood as examples in all respects and not being restrictive. The scope of the present invention is not limited to the configurations of the above-described embodiments but is indicated by Claims. The scope of the present invention is intended to embrace all the modifications within the meaning and range of equivalency of the Claims.

In the above-described embodiment, the flexible printed circuit board includes a single insulating layer and a single conducting layer that is formed on one of the surfaces of the insulating layer. In addition, the scope of the present invention encompasses a configuration in which conducting layers having circuit patterns are formed on both surfaces of a single insulating layer, and these circuit patterns of the plural conducting layers form a spiral pattern in plan view. In this case, the plural circuit patterns are connected together via plural through-holes so as to form a single closed loop in which a current flows counterclockwise or clockwise in the entirety of the spiral pattern, to thereby form a coil having a high coupling coefficient. When the flexible printed circuit board includes plural conducting layers, the magnetic layer is disposed on the outer surface side of one conducting layer out of the outermost conducting layers.

Alternatively, the flexible printed circuit board may be a multilayer flexible printed circuit board including plural insulating layers in which each insulating layer has a conducting layer on one or both of the surfaces. In this case, in the flexible printed circuit board, as described above, the circuit patterns of plural conducting layers may form a single closed loop, or independent circuit patterns may be individually formed in the conducting layers.

Incidentally, a double-sided flexible printed circuit board that includes a single insulating layer and conducting layers formed on both surfaces of the insulating layer may have an average thickness of 100 μm or more and 260 μm or less. A multilayer flexible printed circuit board that includes plural insulating layers and plural conducting layers may have an average thickness of 260 μm or more and 400 μm or less.

The flexible printed circuit board may include, on the front surface or back surface of the curved portion, a support film formed of a material that facilitates maintaining of the curvature. In the flexible printed circuit board, only the coverlay of the curved portion may be formed of a different material that facilitates maintaining of the curvature. This material may be, for example, a liquid crystal polymer.

The flexible printed circuit board may include plural curved portions. In this case, the curvature center lines X's of the plural curved portions are not necessarily parallel to each other, and the flexible printed circuit board may three-dimensionally curve as a whole.

In the flexible printed circuit board, the magnetic layer is not an essential element and can be omitted.

EXAMPLES

Hereinafter, the present invention will be described further in detail with reference to Examples. However, the present invention is not limited to the following Examples.

INDUSTRIAL APPLICABILITY

As has been described, a flexible printed circuit board according to the present invention has a small size and enables efficient transmission and reception of electricity, so that it is suitably applicable to, for example, transmitting antennas, receiving antennas, and transformers for mobile devices such as wearable devices.

The invention claimed is:

1. A flexible printed circuit board comprising:
   at least one insulating layer having flexibility and containing a synthetic resin as a main component; and
   at least one conducting layer including a circuit pattern;
   at least one coverlay disposed on a front surface of the conducting layer, including a covering film and an adhesive layer; and
   a magnetic layer disposed on a back surface of the insulating layer,
   wherein the circuit pattern includes a continuous spiral pattern having a quadrangular outer shape with each of a pair of opposite sides of the quadrangular outer shape being curved in a convex orientation with respect to a center of the circuit pattern;
   the flexible printed circuit board includes a curved portion that curves such that one side and another side of the spiral pattern are disposed at a distance from each other;
   the magnetic layer includes a sheet shaped magnetic sheet having plural grid patterned cracks and covered with a protective film, and a second adhesive layer; and
   the average thickness of the magnetic sheet is 10 μm or more and 1000 μm or less.

2. The flexible printed circuit board according to claim 1, wherein the curved portion has an average radius of curvature of 1 mm or more and 500 mm or less.

3. The flexible printed circuit board according to claim 1, wherein the curved portion curves with respect to, as a center line, a symmetry axis of the spiral pattern having the quadrangular outer shape.

4. The flexible printed circuit board according to claim 3, wherein the spiral pattern has a rectangular outer shape, and the curved portion curves with respect to, as a center line, a minor axis of the rectangular outer shape.

5. An antenna comprising the flexible printed circuit board according to claim 1.

6. A wireless charging device comprising a transmitter and a receiver,
   wherein at least one of the transmitter or the receiver includes the antenna according to claim 5.

* * * * *